(12) United States Patent
Firastrau et al.

(10) Patent No.: US 8,063,709 B2
(45) Date of Patent: Nov. 22, 2011

(54) SPIN-TRANSFER TORQUE OSCILLATOR

(75) Inventors: Ioana Firastrau, Jud. Brasov (RO);
Ursula Ebels, Grenoble (FR); Bernard Dieny, Lans en Vercors (FR)

(73) Assignee: Centre National de la Recherche Scientifique, Paris (FR)

( * ) Notice: Subject to any disclaimer, the term of this patent is extended or adjusted under 35 U.S.C. 154(b) by 9 days.

(21) Appl. No.: 12/525,651

(22) PCT Filed: Feb. 21, 2007

(86) PCT No.: PCT/EP2007/051676
§ 371 (c)(1),
(2), (4) Date: Aug. 3, 2009

(87) PCT Pub. No.: WO2008/101545
PCT Pub. Date: Aug. 28, 2008

(65) Prior Publication Data
US 2010/0039181 A1 Feb. 18, 2010

(51) Int. Cl.
*H03B 17/00* (2006.01)
(52) U.S. Cl. .......................... 331/94.1; 331/3
(58) Field of Classification Search ................. 331/94.1
See application file for complete search history.

(56) References Cited

U.S. PATENT DOCUMENTS

| | | | | |
|---|---|---|---|---|
| 5,695,864 A * | 12/1997 | Slonczewski | ................. | 428/212 |
| 6,532,164 B2 * | 3/2003 | Redon et al. | ..................... | 365/97 |
| 7,589,600 B2 * | 9/2009 | Dimitrov et al. | ............. | 331/94.1 |
| 2006/0183002 A1 | 8/2006 | Yang et al. | | |
| 2006/0198047 A1 | 9/2006 | Xue et al. | | |

OTHER PUBLICATIONS

Firastrau et al; "State diagram for spin current-induced magnetization dynamics using a perpendicular polarizer and a planar free layer", Journal of Magnetism and Magnetic Materials, vol. 310, No. 2 Nov. 20, 2006, pp. 2029-2031.
Grollier et al; "Field dependence of magnetization reversal by spin transfer", Physical Review, B 67, vol. 67, No. 17 May 2003, pp. 174402-1-174402-8.
Mangin et al; Database Inspec [Online] The Institute of Electrical Engineers, Stevenage, GB; Mar. 2006, "Current-induced magnetization reversal in nanopillars with perpendicular anisotrophy" XP002457961 Database accession No. 9386378.
Lee et al; "Analytical investigation of spin-transfer dynamics using a perpendicular-to-plane polarizer", published in Applied Physics Letters 86, 22505 (2005).
Mangin et al; "Current-induiced magnetization reversal in nanopillars with perpendicular anistrophy" published in Nature, vol. 5, Mar. 2006, pp. 210-215.
International Search Report for PCT/EP2007/051676.

* cited by examiner

Primary Examiner — Joseph Chang
(74) Attorney, Agent, or Firm — Pearne & Gordon LLP

(57) ABSTRACT

The invention relates to a method of operating a spin-transfer torque structure to generate voltage oscillations, said structure comprising a first layer of magnetic material having a fixed magnetization vector, a spacer of non magnetic material and a second layer of magnetic material having a free magnetization vector. The method includes the application of a current ($j_{op}$) through said structure and a magnetic field ($H_{ext}$) in the plane of the second layer. It makes use of a region of bistability and hysteretic behaviour to trigger and stop the voltage oscillations.

18 Claims, 8 Drawing Sheets

SPIN-TRANSFER TORQUE OSCILLATOR

TECHNICAL FIELD OF THE INVENTION

The present invention relates to a method for generating RF oscillations, based on the principle of spin momentum transfer.

BACKGROUND OF THE INVENTION

Spin electronic devices are currently a topic of intensive research for various applications ranging from magnetic recording to voltage controlled oscillators (VCOs).

Typically, a spin electronic device is based on a magnetic multilayer structure comprising a first ferromagnetic layer of fixed magnetization direction, also called polarization layer or pinned layer, a non-magnetic spacer of metallic or insulating material and a second ferromagnetic layer of variable magnetization orientation, also called for this reason free layer. The spacer provides for a magnetic decoupling of the first and second ferromagnetic layers. If the spacer is an insulating layer, a magnetic tunnel junction (MTJ) is obtained whereas if it is a metallic layer one obtains a so called spin valve (SV) structure. Spin valves and magnetic tunnel junctions have received considerable attention, mainly for their giant magneto-resistance (GMR) properties. Giant magneto-resistance arises from spin dependent scattering (SV) or spin dependent tunnelling (MTJ). For example, the resistance of a spin valve is low if the pinned layer and free magnetic layer have parallel magnetization directions, whereas it is high, if they are antiparallel. Reversal of the magnetization of the free layer can be obtained by applying an external magnetic field.

In U.S. Pat. No. 5,695,864, another type of reversal mechanism has been proposed where the magnetization reversal is induced by exchange interaction between the free layer magnetization and conduction electrons flowing through or reflected by the free layer.

According to a first type of device, known as planar spin valve, the magnetization vectors of the polarization layer and the free layer both lie in the plane of the layers. In absence of current flowing through the structure, the magnetization vectors are in a stable configuration, either parallel or antiparallel. However, when a current or a current pulse is applied to the device, the electrons passing through the pinned layer have their spins polarized and interact with electrons of the free layer, causing the magnetization vector thereof to precess about its original axis. Depending upon the amplitude and sign of the current, the respective magnetization directions of the pinned layer and the free layer, and the amplitude and orientation of the external field, if any, the cone precession angle either decreases back to zero, stabilizes at a given value or increases until it eventually reaches 180°, thus reversing the magnetization vector of the free layer.

Another promising device is the so called perpendicular polarizer (PERP). In such a device, by contrast with a planar spin valve or a MTJ, the magnetization direction of the polarization layer is orthogonal to the plane of the layers, while the magnetization of the free layer is kept in-plane. As for the planar spin valve, under certain operating conditions, the spins of the electrons polarized by the pinned layer, cause the magnetization vector of the free layer to precess, in this instance about an axis perpendicular to the plane of the layers. The perpendicular magnetization of the polarization layer is achieved by using materials with high perpendicular magnetic anisotropy, as described by S. Mangin et al. in the article entitled "Current-induced magnetization reversal in nanopillars with perpendicular anisotropy" published in Nature, Vol. 5, March 2006, pages 210-215.

Planar spin torque devices and perpendicular polarizer structures have both been used in the prior art for implementing magnetic memory cells. The transfer of angular momentum from the polarized electrons to the free layer magnetization vector can be modelled as an effective torque which, for sufficient current densities, is high enough for switching the magnetization vector of the free layer. The state of the magnetization vector can be used for storing a binary information.

An example of perpendicular polarizer used as magnetic RAM cell has been described e.g. in U.S. Pat. No. 6,532,164 filed in the name of the present Applicant.

For a planar spin torque device, under application of an appropriate magnetic field, a DC current of polarized electrons may cause a precession of the magnetization vector of the free layer without switching it or dampening its motion. The magnetization vector of the free layer enters then a steady oscillating state. The rotating in-plane component of the magnetization vector induces a modulation of the magnetoresistance which in turn generates an oscillating voltage between the polarization layer and the free layer. The oscillation frequency is at the threshold current close to the ferromagnetic resonance frequency of the free layer, i.e. typically lies in the GHz range. Furthermore, the precession frequency and, hence, the oscillation frequency of the oscillations can be tuned by properly controlling the intensity of the DC current.

A tuneable RF oscillator using a planar spin valve structure, based on this principle has already been disclosed in WO2005/064783. It was also suggested by K. J. Lee et al. in their article entitled "Analytical investigation of spin-transfer dynamics using a perpendicular-to-plane polarizer", published in Applied Physics Letters 86, 22505 (2005), that a perpendicular polarizer would be suitable for use as microwave source. A tuneable frequency in the range 1-20 GHz has been predicted without application of an external magnetic field.

A major problem affecting spin-transfer torque oscillators, either of planar spin valve type or perpendicular polarizer type, is the large current density required for obtaining and sustaining the voltage oscillations. This current density, also called critical current density, can be expressed for a planar structure as follows:

$$j_c = \frac{2e}{\hbar} \frac{M_s \tau}{g(\theta = 0)} \alpha (H_u + H_b + 2\pi M_s) \quad (1)$$

and for the perpendicular polarizer:

$$j_c = \frac{2e}{\hbar} \frac{M_s \tau}{g(\theta = \pi/2)} \frac{H_u}{2} \quad (2)$$

where $M_s$ is the saturation magnetization, $\tau$ is the thickness of the free layer, $H_u$ is the effective uniaxial in-plane anisotropy field in the free layer, $\alpha$ is the Gilbert damping coefficient and $g(\theta)$ is a spin-torque efficiency factor depending upon the angle $\theta$ between the magnetization vectors of the free layer and the pinned layer.

The critical current density typically lies about $10^7$ A/cm$^2$. At such current density level, the heat generated by Joule effect and hence the temperature rise may damage the structure or severely deteriorate its characteristics.

It can be seen from expressions (1) and (2) that the critical current density can be lowered by decreasing the saturation magnetization, the thickness and/or the damping coefficient. However, decreasing the thickness and the saturation magnetization would lead to thermal instability whereas low damping coefficients can hardly be achieved with materials currently employed in the aforementioned structures.

The problem underlying the invention is therefore to design a spin-transfer torque oscillator having a low operating current density while exhibiting good thermal stability.

SUMMARY OF THE INVENTION

This problem is solved by implementing the method for operating a spin-transfer torque oscillator as defined in appended claims 1, 2 or 9.

DESCRIPTION OF ILLUSTRATIVE EMBODIMENTS

Figure 1:
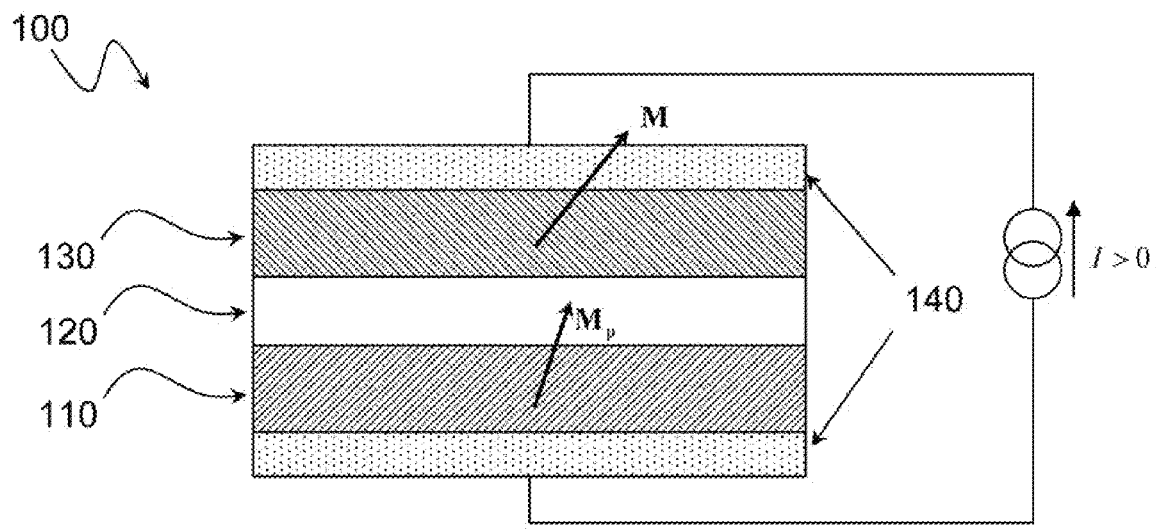
FIG. 1 schematically illustrates a spin-transfer torque structure for use with the method of the invention.

The present invention makes use of a spin-transfer torque structure as illustrated in FIG. 1. This structure 100, comprises a first magnetic layer 110 of fixed magnetization direction, a non-magnetic spacer 120 of metallic, insulating or semi-conducting material and a second magnetic layer 130 of variable magnetization orientation. By magnetic material we understand a material exhibiting a long range order of its magnetic moments and hence a non-zero spontaneous saturation magnetization. Examples of magnetic material are ferromagnetic materials as Co, Fe, Ni and their alloys or ferromagnetic materials.

According to a first variant, the first magnetic layer 110 (hereinafter also referred to as pinned or fixed layer) can be made out of a single magnetic material such as the ones as recited above. Alternatively, it can be coupled with an antiferromagnetic material to improve its magnetic properties.

According to a second variant, the first magnetic layer 110 comprises a very thin (less than 1 nm thick) non-magnetic (NM) layer inserted into a layer of magnetic material. The NM layer is chosen to produce a spin dependent interface scattering for tuning the spin dependent transport properties of the magnetic layer. Again, this laminated structure can be coupled with an antiferromagnetic material to improve its magnetic properties.

According to a third variant, the fixed magnetic layer 110 can be a multilayer stack of different magnetic layers, such [Co/Ni]×n. To improve its magnetic properties, this multilayer stack can be coupled to an antiferromagnetic material.

According to a fourth variant, the first magnetic layer 110, can be realized by a multilayer structure e.g. (FM1/NM/FM2)×n where the two magnetic layers FM1 and FM2 are coupled via a non-magnetic layer to have their magnetization aligned antiparallel or parallel. The nonmagnetic NM layer material and thickness are chosen such that it mediates an exchange coupling between the two magnetic layers (such as Ru, Cu, Pt) and/or induces an interface anisotropy, the choice depending on the desired magnetic properties required for the precise application. To improve its magnetic properties, the multilayer stack can be coupled to an antiferromagnetic material. Examples of such a multilayer structure are Co/Ru/Co and CoFe/Ru/CoFe, called a synthetic antiferromagnet, where the two FM layers are coupled antiparallel for a proper choice of the Ru thickness. Another example are (Co/Pt)×n multilayers, where the FM layers are coupled parallel and the magnetisation has an out of plane anisotropy for the proper choice and optimisation of the Co and Pt layer thicknesses.

According to a fifth variant, the first magnetic layer can be a combination of any of the variants recited above.

At any rate, the first magnetic layer should exhibit a strong out-of-plane anisotropy and a strong spin polarization. The magnetization vector $M_p$ is preferably chosen orthogonal to the plane of the layers. However, an oblique magnetization direction i.e. out of to the plane of the layers may equally be considered and is encompassed in the scope of the present invention.

The second magnetic layer (hereinafter also referred to as free layer) 130 can be realized according to any of the five variants set out above.

The non magnetic spacer may be a thin layer of non-magnetic metal such as Cu, a thin non-magnetic insulating tunnel barrier of $AlO_3$ or MgO or any suitable oxide layer or a thin non-magnetic semiconductor layer. By thin layer of non-magnetic metal we mean here that the thickness of this layer is smaller than the metal spin diffusion length, so that a sufficient spin polarisation is maintained when electrons travel through the non-magnetic metal. By thin layer of insulating material we mean here that there is a sufficiently strong tunnel effect and that tunnel magneto-resistance is maintained when the electrons tunnel through the barrier.

Contact electrodes 140 (e.g. of Cu/Ta, Al, Au or any material whose surface resistance $R_\square$ is sufficiently low) are respectively deposited at the bottom of the pinned layer 110 and on the top of the free layer 130. A DC current l of density j is injected via these electrodes through the structure 100 i.e. spin-polarized electrons flow from the pinned layer 110 (or are reflected therefrom) through the non-magnetic spacer 120 to the free layer 130, thereby inducing a precession of the magnetization vector hereinafter denoted M.

The active part of the structure is laterally confined to a small region by the shape of the contact electrodes or by the shape of the structure itself. In the latter instance, the layers can be patterned into pillars (nanopillars) of any shape with lateral dimensions small enough for the spin transfer torque effect being dominant over other physical forces acting on the magnetization, such as for example those due to the Oersted field created by the current flowing through the pillar. A typical dimension is 100 nm.

If we assume the magnetization vector is uniform throughout the free layer (macrospin model) or its active part, the dynamics of the magnetization vector M can be described by the Landau-Lifschitz-Gilbert equation including the spin torque term:

$$\frac{dM}{dt} = -\gamma(M \times H) + \frac{\alpha}{M_s} M \times \frac{dM}{dt} + \gamma \frac{a_j(\theta)}{M_s} M \times (M \times p) \quad (3)$$

where H is the effective magnetic field, i.e. the magnetic field effectively experienced by the free layer, p is a unitary vector along the electron polarization direction, $\alpha$ is a damping coefficient, $\gamma$ denotes the gyromagnetic ratio, and $$a_j(\theta) = \frac{\hbar}{2e} \frac{g(\theta)}{M_s \tau} j \quad (4)$$

with the same convention of notation as above and recalling that j is the current density through the structure.

The effective magnetic field H is the sum of the external magnetic field $H_{ext}$, the demagnetization field $H_d$, i.e. the field generated by the magnetization vector M itself, and the anisotropy field $H_u$ accounting for the anisotropic magnetic energy distribution within the free layer.

The first term in the right-hand side of equation (3) is responsible for the precession of the magnetization vector. The second term expresses the energy dissipation along the motion of the magnetization vector. The third term denotes the spin-transfer torque induced by the injection of spin-polarized electrons.

For illustrative purposes, we will assume in the following that the magnetization vector $M_p$ of the pinned layer and hence the polarization vector p is perpendicular to the plane of the layers. The invention is however not intended to be limited to this specific case.

Figure 2:
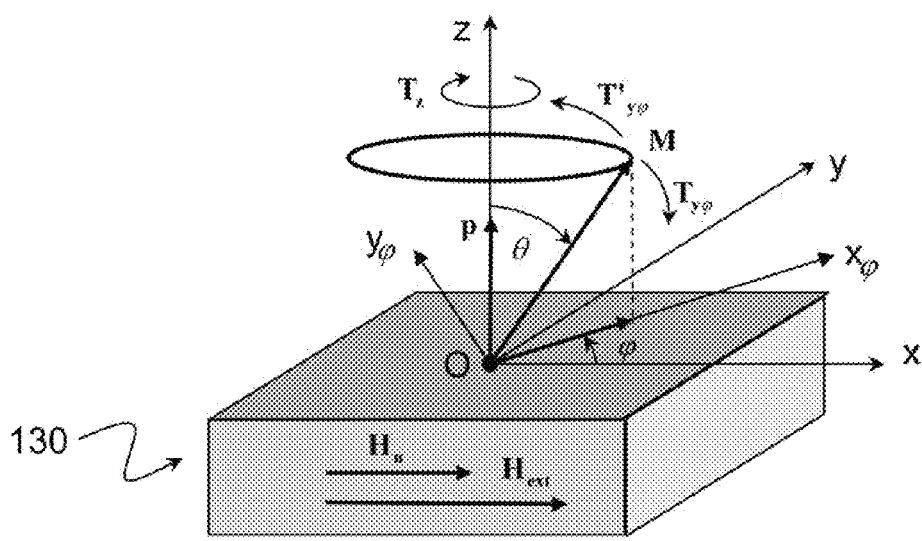
FIG. 2 illustrates the torque components acting upon the magnetization of the free layer in the structure of FIG. 1.

FIG. 2 shows the various torque components acting upon the magnetization vector M of the free layer.

The effective magnetic field is assumed to lie in the plane of the layer, parallel to the axis Ox. Furthermore, the anisotropy field $H_u$ is also assumed to be oriented along the positive x-axis.

The angle between polarization vector p and the magnetization vector M is denoted $\theta$. The angle between the projection of the magnetization vector and the positive x-axis is denoted $\phi$. The first term of expression (3) is a torque $T_z$ causing vector M to precess about the axis Oz, here clockwise. The second term of this expression is a torque $T_{y\phi}$ around the rotating axis $Oy_\phi$ tending to pull the vector M towards the plane of the layer i.e. towards its position of minimum energy ($\theta=0$; $\phi=0$ or $\pi$). The last term of the expression is a torque $T'_{y\phi}$ induced by the spin-polarized electrons, pulling the magnetization vector out of plane and tending to align it with the polarization vector p. If the spin-transfer torque $T'_{y\phi}$ balances the damping torque $T_{y\phi}$, a precession at a constant angle $\theta$ may take place.

The composite action of the three torques $T_z$, $T_{y\phi}$, $T'_{y\phi}$ is in general quite complex. It depends in the first place upon the value of the spin-polarized current and the value of the effective magnetic field.

It is first assumed that the current is null. The initial state of the magnetization vector is an equilibrium state of minimum energy, i.e. the magnetization vector is aligned with the effective magnetic field. In other words, the magnetization vector is oriented either in the positive or in the negative direction of the x-axis ($\phi=0$ or $\phi=\pi$).

When the current density increases, the magnetization vector M is statically oriented away from its original position but nevertheless essentially remains in the plane of the layer, that is $\theta=0$ and $\phi\neq 0$, $\phi\neq\pi$.

When the current density reaches a first threshold value $j_{c1}$, the magnetization vector M starts to be dragged out of the plane of the layer and to precess about the Oz axis in a continuous manner. The first threshold value $j_{c1}$ can be approximated by:

$$j_{c1} = \frac{2e}{\hbar} \frac{M_s \tau}{g(\theta = \pi/2)} \left(\frac{H_u}{2} \pm H_{ext}\right) \quad (5)$$

where $H_u$ and $H_{ext}$ are respectively the values of the anisotropy field and of the external magnetic field (taken positive if oriented along the positive x-axis). The ± sign in expression (5) depends upon the initial orientation of the magnetization vector: if $\phi=0$ the sign is positive whereas if $\phi=\pi$ the sign is negative. Although not mentioned, the sign of $j_{c1}$ is the sign of the injected current.

The half-angle of the precession cone is given by equating the spin-torque and the damping torque, i.e. the $3^{rd}$ and $2^{nd}$ terms of expression (3), which leads to the equation:

$$\cos\theta = \frac{a_j(\theta)}{\alpha} \frac{1}{4\pi M_s + H_u/2} \quad (6)$$

where $a_j(\theta)$ can roughly be approximated by $a_j(\pi/2)$.

The associated precession frequency, namely the frequency of the spin-transfer torque oscillator, is approximately given by:

$$f = \frac{\gamma |a_j(\theta)|}{2\pi\alpha} \quad (7)$$

If the current density is further increased, the magnetization vector turns more and more out of plane, i.e. the angle $\theta$ gets closer to 0 or $\pi$. However when the current density reaches a second threshold value $j_{c2}$ the out-of-plane component $M_z$ of the magnetization vector M saturates, that is $M_z=M$ and the precession stops. The magnetization vector M lies thus in a stable out-of-plane state and consequently the oscillations vanish.

The second threshold value $j_{c2}$ can be expressed as:

$$j_{c2} = \begin{cases} \frac{2e}{\hbar} \frac{4\pi\alpha M_s^2 \tau}{g(0)} & \text{for } j < 0 \\ \frac{2e}{\hbar} \frac{4\pi\alpha M_s^2 \tau}{g(\pi)} & \text{for } j > 0 \end{cases} \quad (8)$$

Figure 3:
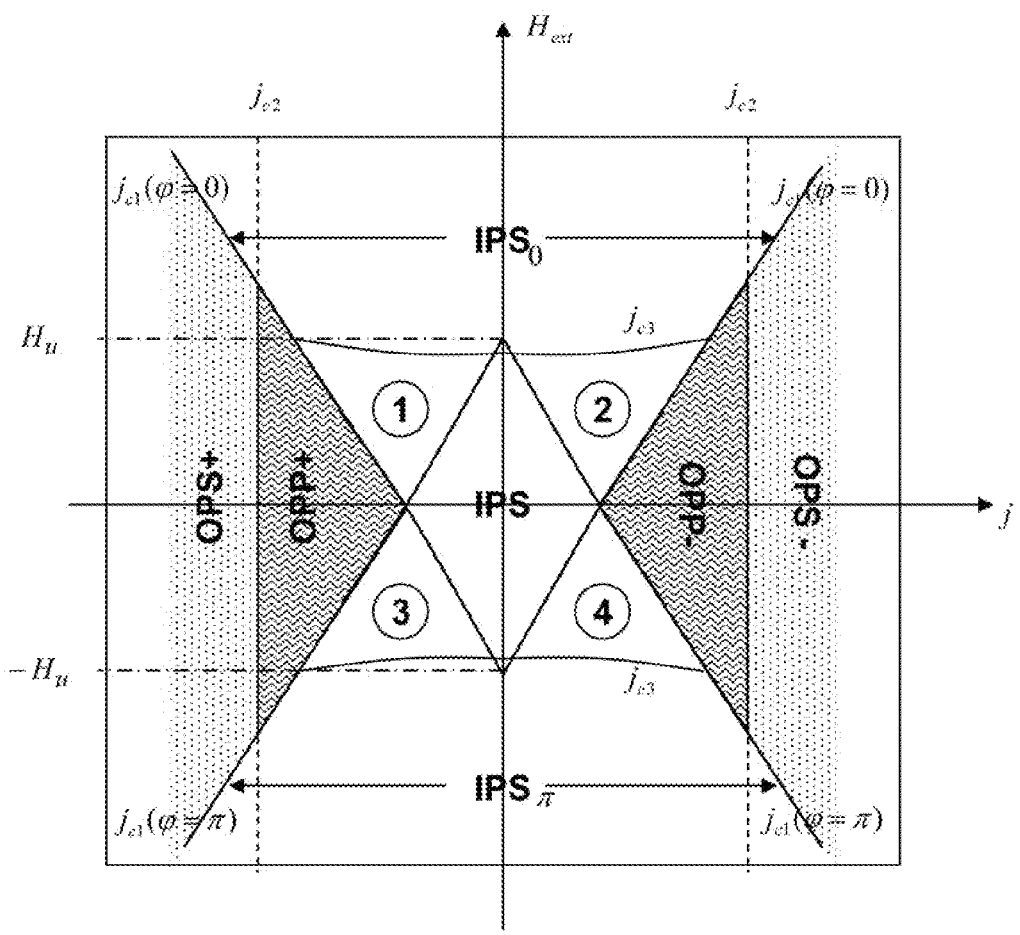
FIG. 3 illustrates a state diagram of the spin-transfer torque structure represented in FIG. 1.

As it can be seen from (8), the second threshold value does not depend upon the value of the external magnetic field $H_{ext}$ (this holds as long as the external field is less than approximately half the demagnetization field $4\pi M_S$). FIG. 3 illustrates schematically a state diagram of the free layer as a function of the intensity of the spin-polarized current and the external magnetic field $H_{ext}$.

Three sets of critical lines can be identified, respectively denoted $j_{c1}$, $j_{c2}$ and $j_{c3}$.

The first set of critical lines $j_{c1}$ corresponds to the first threshold value of current density. Two subsets can be distinguished, respectively corresponding to the case where the magnetization vector is initially aligned with the positive ($\phi=0$) or with the negative ($\phi=\pi$) x-axis. Each subset is symmetric about the zero-current axis, the two lines constituting the subset corresponding to opposite current directions.

The second set of critical lines $j_{c2}$ corresponds to the second threshold value of current density. The two lines of this set correspond to opposite current directions.

The first and second sets of critical lines delimit four regions denoted OPP+, OPP−, OPS+ and OPS− in the state diagram.

The triangularly shaped regions OPP+, OPP− correspond to an out-of-plane precessing state of the magnetization vector, in the upper half-space ($\theta<\pi/2$) and in the lower half space ($\theta>\pi/2$), respectively. When the operating point lies in either OPP+ or OPP−, i.e. if $j_{c1}<|j|<j_{c2}$, the structure works as an oscillator.

The regions OPS+ and OPS− correspond to an out-of-plane stable static state of the magnetization vector in the upper and the lower half spaces, respectively. More precisely, if the operating point lies in the OPP+ resp. OPP− region and if the current is increased in absolute value, the free layer enters the stable out-of-plane magnetization region OPS+, resp. OPS−.

The regions left blank in the diagram correspond to stable static in-plane states, either for an initial magnetization vector aligned along the positive x-axis ($\phi=0$), $IPS_0$, or aligned along the negative x-axis ($\phi=\pi$), $IPS_\pi$, or for both aforementioned cases, IPS. When the operating point is located in these regions and the current density is increased in absolute values, the magnetization vector is rotated in-plane, away from its minimum energy orientation ($\phi=0$ or $\phi=\pi$) until it eventually reaches the first threshold value or the second threshold value and starts moving out of the plane of the free layer.

The third set of critical lines $j_{c3}$ is also derived from the resolution of equation (3). The location of these lines is not fixed but depends upon the rise time of the current. The upper (resp. lower) line $j_{c3}$ is vertically bounded by the horizontal line $H_{ext}=H_u$ (resp. $H_{ext}=-H_u$).

The critical lines $j_{c1}$ and $j_{c3}$ delimit four regions denoted (1) to (4) in the state diagram. Region (1) (resp. (2)) corresponds to an in-plane stable static state for an initial magnetization with $\phi=0$ whereas it is an out-of-plane precessing state in the upper (resp. lower) half space region for an initial magnetization with $\phi=\pi$. Similarly region (3) (resp. (4)) corresponds to an in-plane stable static state for an initial magnetization with $\phi=\pi$ whereas it is an out-of-plane precessing state in the upper (resp. lower) half space region for an initial magnetization with $\phi=0$.

Figure 4:
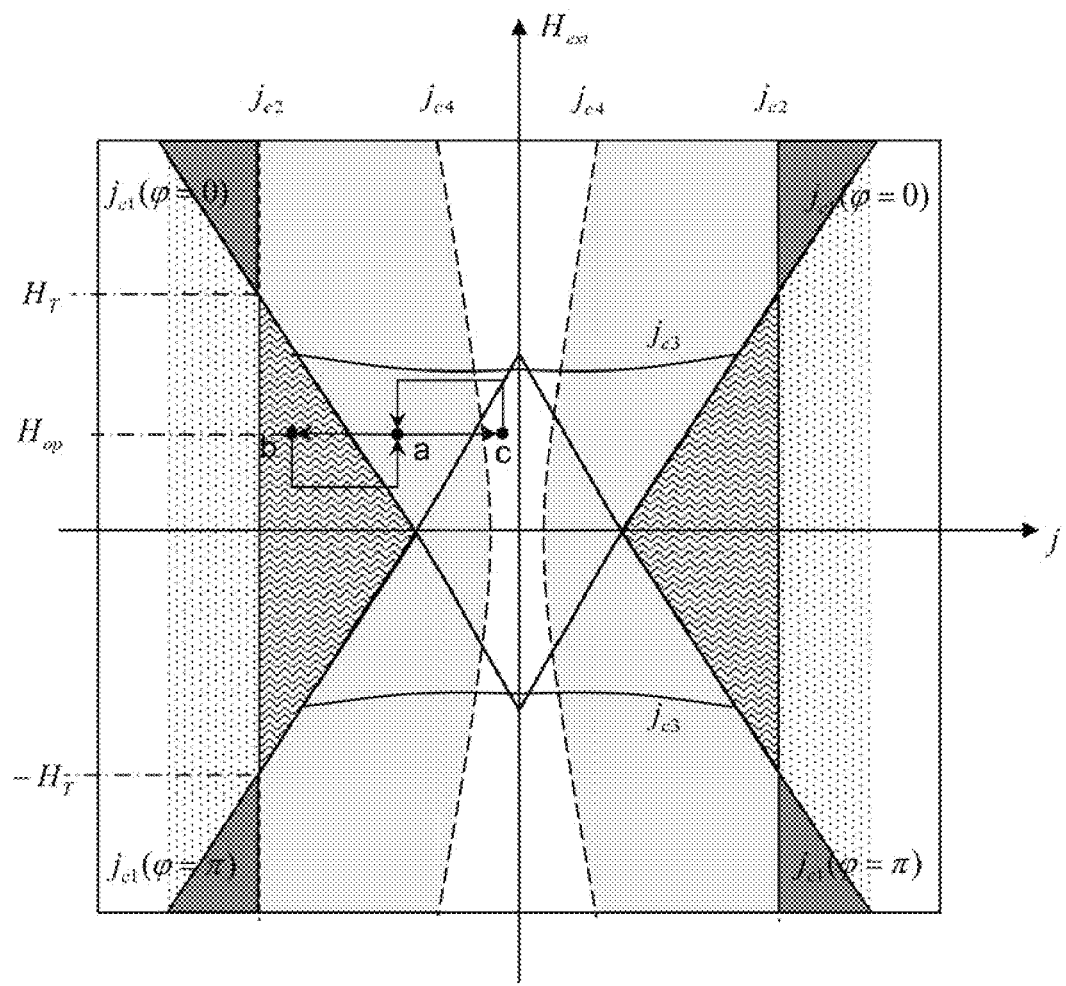
FIG. 4 illustrates a method for operating said structure as an oscillator, according to a first embodiment of the invention.

The invention is based on the discovery of two regions of bistability as illustrated in FIG. 4. This figure shows the same state diagram as in FIG. 3 where most of the references have however been omitted for the sake of clarity.

The first region of bistability is coloured in light grey. This region is comprised between the set of critical lines $j_{c2}$ and a fourth set of critical lines $j_{c4}$, comprising of two lines symmetrically located around the zero current axis but excludes the triangularly shaped OPP+ and OPP− regions.

The first region of bistability is therefore defined by the constraint:

$$j_{c4}<|j|<j_{c1} \text{ for } j_{c1}<j_{c2} \text{ i.e. for } |H_{ext}|<H_T$$

$$j_{c4}<|j|<j_{c2} \text{ for } j_{c1}>j_{c2} \text{ i.e. for } |H_{ext}|>H_T \qquad (9)$$

where $H_T$ denotes the value of $H_{ext}$ for which the first critical lines cross the second critical lines. Note that this value may be different depending on the sign of the current j, in accordance with expression (8).

In this first region of bistability an out-of plane precessing state OPP, i.e. either OPP+ or OPP− and an in-plane static state are both stable. The type of state depends on the previous history of the magnetization vector. More precisely, if the magnetization vector was in a precessing OPP state ($|H_{ext}|<H_T$) when entering the first bistability region, it remains in a precessing state. Conversely, if the magnetization vector was in a static IPS state when entering the first bistability region, it remains in a static IPS state.

The second region of bistability is coloured in dark grey. This region is comprised between the set of critical lines $j_{c2}$ and the set of critical lines $j_{c1}$ as expressed by the constraint:

$$j_{c1}<|j|<j_{c2} \text{ for } j_{c2}>j_{c1} \text{ i.e. for } |H_{ext}|>H_T \qquad (10)$$

In this second region, an out-of plane static state (OPS) and an in-plane static state (IPS) are both stable. Again, the type of state depends on the previous history of the magnetization vector. If the magnetization vector was in an OPS state when entering the second bistability region, it remains in an OPS state. Conversely, if the magnetization vector was in an IPS state when entering the bistability region, it remains in an IPS state.

We will now consider the case where the operating point originally lies in the region $j_{c1}<j_{c2}$, that is $|H_{ext}|<H_T$.

First, it is important to note that the transition between a precessing state (OPP) and a static state (IPS) is hysteretic, the transition from a static state to a precessing state being determined by the first set of critical lines and the transition from a precessing state to a static state being determined by the fourth set of critical lines.

This hysteretic behaviour will now be shown by way of example with the cycle a→b→a→c→a. The whole cycle is at a constant external magnetic field value $H_{op}$, which may be null.

The starting state (a) is assumed static. This means, in general, that the state (a) lies either in the IPS region or in one of the regions (1)-(2) where the initial angle of the magnetization vector was $\phi=0$ or in one of the regions 3-4 where the initial angle of the magnetization vector was $\phi=\pi$. In the present instance, (a) lies in region (1) with $\phi=0$ but the other cases may equivalently be considered.

The current is first ramped up in absolute values and the operating point moves to state (b) which lies in the region OPP+. As the first critical line $j_{c1}$ is crossed, precession takes place and the structure generates an oscillating voltage.

The current is then ramped down and the operating point crosses back the first critical line to arrive at a state of lower density current e.g. initial state (a) at which the voltage keeps oscillating. Hence, due to the hysteretic behaviour, the structure continues to generate an oscillating voltage but with a density current which lies below the first threshold value.

For stopping the oscillations, it suffices to ramp down the current in absolute values so that the operating point crosses the fourth critical line $j_{c4}$ hereinafter referred to as third threshold value. At state (c), the magnetization vector is static. When the operating point is brought back into the region of bistability e.g. to the initial state (a), the magnetization vector is maintained static.

Although the operation of the structure has been illustrated with a cycle located in the upper left quarter of the diagram, it is clear that other cycles can be envisaged mutatis mutandis in the three other quarters thereof.

It will therefore be understood that, according to a first embodiment of the invention, the spin-transfer torque structure can be operated as an oscillator at low current density by:

setting the operating point of the spin-transfer structure in a region of bistability where the magnetization vector of the free layer can be either in a stable static state or a stable precessing state e.g. (state (a));

increasing the current density in absolute values until it crosses a first threshold value ($|j_{c1}(H_{op})|$), thereby inducing a precession of the magnetization vector of the free layer (state (b);

decreasing the current density in absolute values until it crosses back said first threshold value, the magnetizing vector of the free layer being thereby kept in said precessing state.

For switching off the oscillator, the current density is decreased in absolute values until a second threshold value is crossed ($|j_{c4}(H_{op})|$), i.e. the operating point is moved out of the first region of bistability (state (c)) into a region where only a static state of said magnetization vector is stable. The operating point may then be moved back in the first region of bistability by increasing the current in absolute values (state (a)) for a further operation cycle.

Hence, according to the first embodiment, the spin-transfer torque oscillator can be turned on by applying a current pulse of appropriate polarity and sufficient magnitude to cross the first threshold value. Conversely, it can be switched off by applying a current pulse of opposite polarity and sufficient magnitude to cross the second threshold value.

Figure 5:
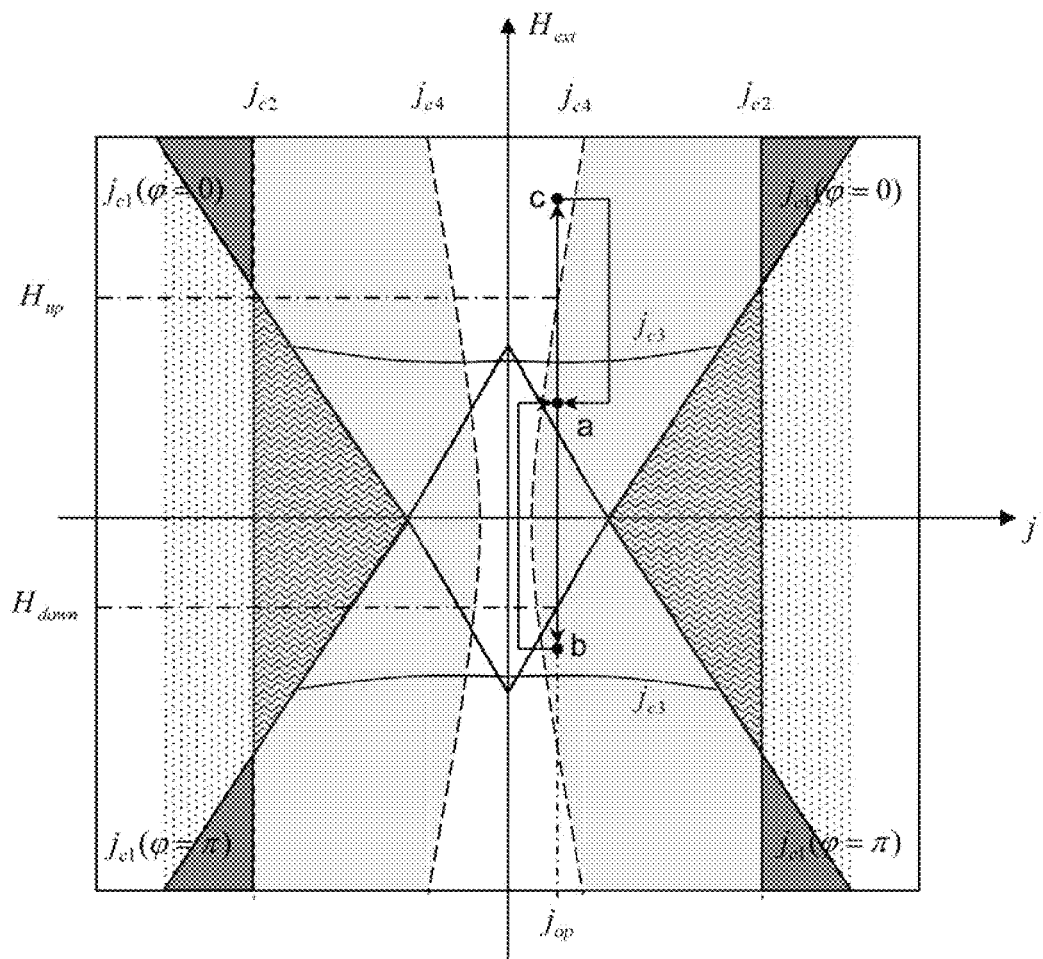
FIG. 5 illustrates a method for operating said structure as an oscillator, according to a second embodiment of the invention.

FIG. 5 illustrates a method for operating the spin-transfer structure as an oscillator, according to a second embodiment of the invention.

This figure shows an example of operation cycle a→b→a→c→a performed at a constant current density value $j_{op}$.

The starting state (a) is assumed static. This means, as for the first embodiment, that it lies either in the IPS region or in one of the regions (1)-(2) where the initial angle of the magnetization vector was $\phi=0$ or in one of the regions (3)-(4) where the initial angle of the magnetization vector was $\phi=\pi$. In the present instance, (a) lies in region (2) with $\phi=0$ but the other cases may equally be considered.

The external magnetic field is decreased until it crosses a threshold value $H_{down}$ such that $|j_{op}|>|j_{c1}(H_{down})|$ at which precession starts and the structure consequently generates an oscillating voltage. In the present instance, the operating point is moved to state (b) in region (4). Since the initial angle of the magnetization vector was $\phi=0$, this point corresponds also to a stable out-of-plane precessing state.

For stopping the oscillations, the external magnetic filed $H_{ext}$ is increased until it crosses a threshold value $H_{up}$ such that $|j_{op}|<|j_{c4}(H_{up})|$ i.e. the operating point crosses the fourth critical line $j_{c4}$. At state (c), the magnetization vector is static. If the operating point is brought back into the region of bistability e.g. to the initial state (a), the magnetization vector is still static.

It will therefore be understood that, according to a second embodiment of the invention, the spin-transfer torque structure can be operated as an oscillator at low current density by:

setting the operating point of the spin-transfer structure in a region of bistability where the magnetization vector of the free layer can be either in a stable static state or a stable precessing state e.g. (state (a));

varying the external magnetic field until it crosses a third threshold value ($H_{down}$), thereby inducing a precession of the magnetization vector of the free layer (state (b));

varying the external magnetic field in the opposite direction until it crosses back said third threshold value, the magnetizing vector of the free layer being thereby kept in said precessing state.

For switching off the oscillator, the external magnetic field is varied in said opposite direction until it crosses a fourth threshold value ($H_{up}$), thereby moving the operating point out of said first region of bistability into a region where only a static state of said magnetization vector is stable (state (c)). The operating point may then be moved back in the first region of bistability ((state (a)) by varying the magnetic field in said predetermined direction until it crosses back said fourth threshold value. The oscillator is then ready for a further operation cycle.

Hence, according to the second embodiment, the spin-transfer torque oscillator can be turned on by applying a magnetic field pulse of appropriate polarity and sufficient magnitude to cross the third threshold value. Conversely, it can be switched off by applying a magnetic field pulse of opposite polarity and sufficient magnitude to cross the fourth threshold value.

Figure 6:
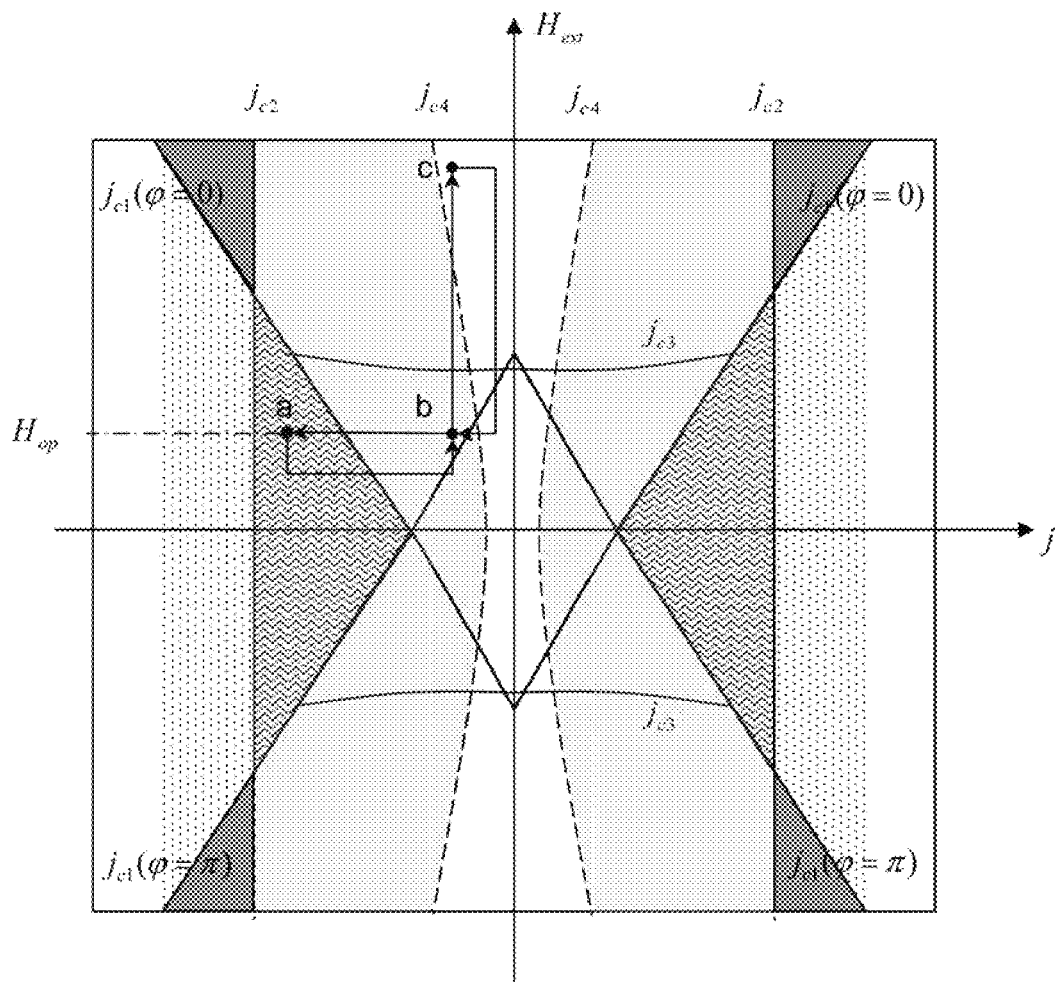
FIG. 6 illustrates a method for operating said structure as an oscillator, according to a third embodiment of the invention.

FIGS. 6 illustrates a method for operating the spin-transfer structure as an oscillator, according to a third embodiment of the invention. In this embodiment, the spin torque oscillator is switched on by applying a current pulse of given polarity and switched off by applying an external magnetic field pulse of a given polarity.

More specifically FIG. 6 shows an operating cycle a→b→a→c→a in which the switching on half-cycle a→b→a is identical to a switching on half-cycle a→b→a of the first embodiment whereas the switching off half-cycle a→c→a is identical to a switching off half-cycle of the second embodiment.

Figure 7:
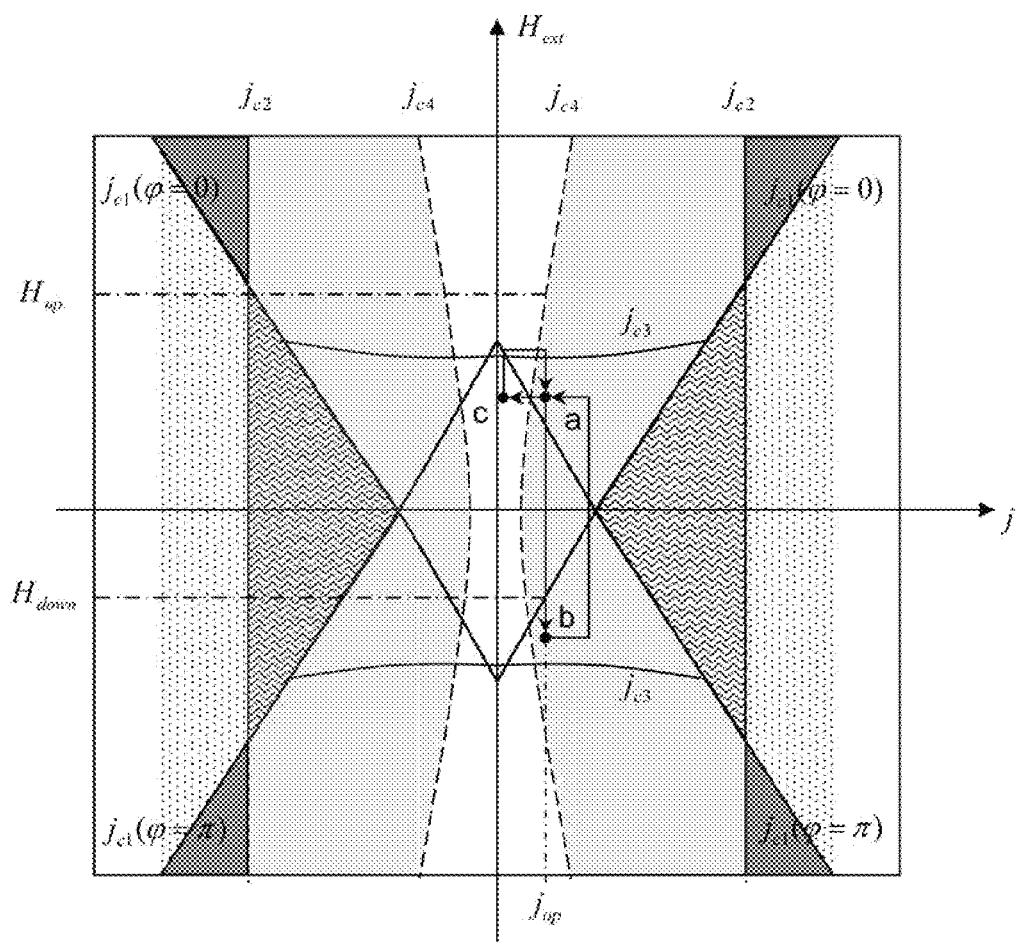
FIG. 7 illustrates a method for operating said structure as an oscillator, according to a fourth embodiment of the invention.

FIGS. 7 illustrates a method for operating the spin-transfer structure as an oscillator, according to a fourth embodiment of the invention. In this embodiment, the spin torque oscillator is switched on by applying an external magnetic field pulse of given polarity and switched off by applying a current pulse of a given polarity.

More specifically FIG. 7 shows an operating cycle a→b→a→c→a in which the switching on half-cycle a→b→a is identical to a switching on half-cycle a→b→a of the second embodiment whereas the switching off half-cycle a→c→a is identical to a switching off half-cycle of the first embodiment.

Figure 8:
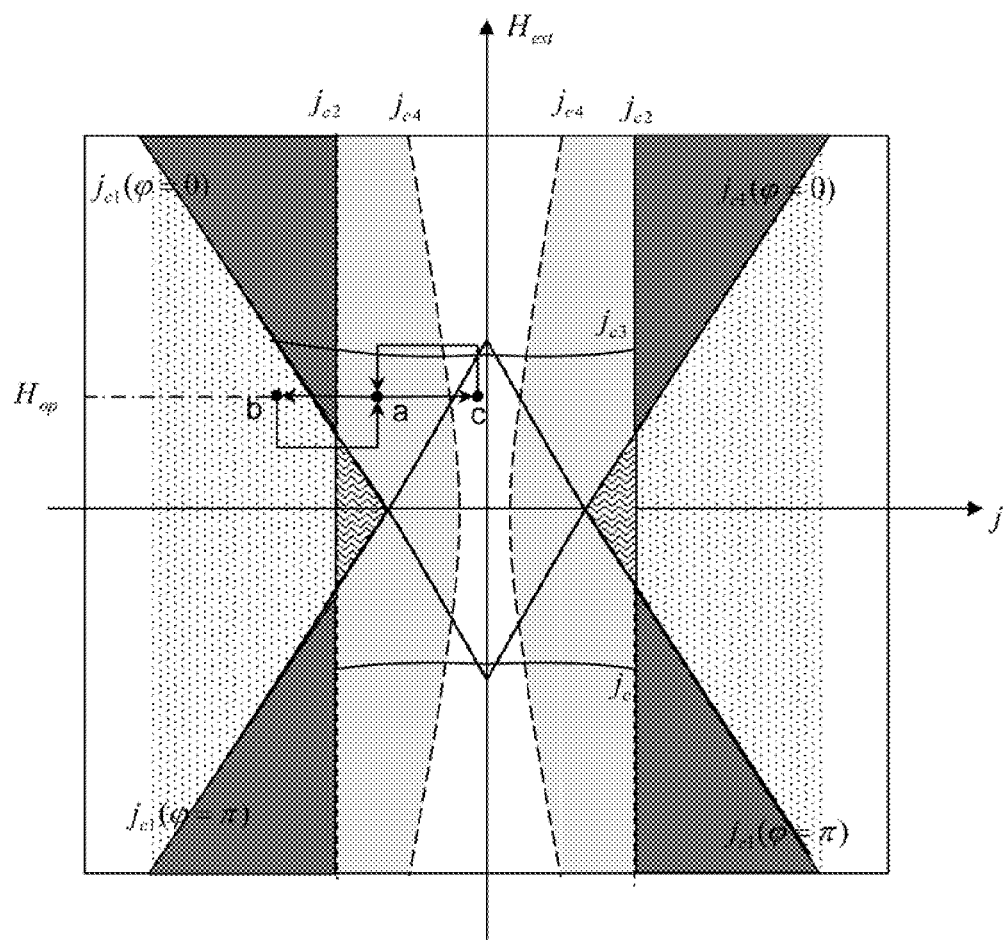
FIG. 8 illustrates a method for operating said structure as an oscillator according to a fifth embodiment of the invention.

We will now consider the case where the operating point originally lies in the region $j_{c1}>j_{c2}$, that is $|H_{ext}|>H_T$. In order to better illustrate the operation of the spin-torque structure in this region, we have represented in FIG. 8 a situation where $j_{c1}(H_{ext}=0)$ is smaller than in the previous embodiments.

It should be understood that if $j_{c2}(H_{ext}=0) \leq j_{c1}(H_{ext}=0)$ i.e. if:

$$H_u/2 \leq \alpha 4\pi M_S \qquad (11)$$

the triangularly shaped zones OPP+ and OPP– simply do not exist.

Turning back to FIG. 8, an operating cycle a→b→a→c→a has been represented. The whole cycle is performed at a constant external magnetic field value $H_{ext}$, which may be null.

The starting state (a) lies in the first bistability region and is assumed to be in-plane static (IPS). When the current is ramped up in absolute values the operating point moves first through the second bistability region while remaining in an IPS state, crosses then the first critical line $j_{c1}$, at which point the magnetization vector jumps to an out-of-plane stable state (OPS), and eventually reaches state (b).

The current is then ramped down and the operating point crosses back the first critical line. When the operating point moves through the second bistability region, the magnetization vector remains in an OPS state, since the OPS state is stable in this region. However, when it crosses back the second critical line and enters the first bistability region, the magnetization vector becomes unstable and starts to precess. The operating point reaches state (a) while remaining in an OPP state.

For switching off the oscillator, the current is decreased in absolute values until it crosses the fourth critical line $j_{c4}$. The operating point leaves the first bistability region and enters a region where only a static state is stable. The operating point may then be moved back in the region of bistability by increasing the current in absolute values (state (a)) for a further operation cycle.

It will therefore be understood that, according to a fifth embodiment of the invention, the spin-transfer torque structure can be operated as an oscillator at low current density by:
  setting the operating point of the spin-transfer structure in a first region of bistability where the magnetization vector of the free layer can be either in a stable static state or a stable precessing state e.g. (state (a));
  increasing the current density in absolute values until it crosses a first threshold value ($|j_{c1}(H_{op})|$), thereby causing the magnetization vector to move out of the plane of the free layer (state (b));
  decreasing the current density in absolute values until it crosses back the second critical line jc2, thereby causing the magnetization vector of the free layer to enter a precessing state.

Hence, as in the first embodiment the spin-transfer torque oscillator can be turned on and off by applying pulses of opposite polarity and sufficiently large amplitude.

Figure 9:
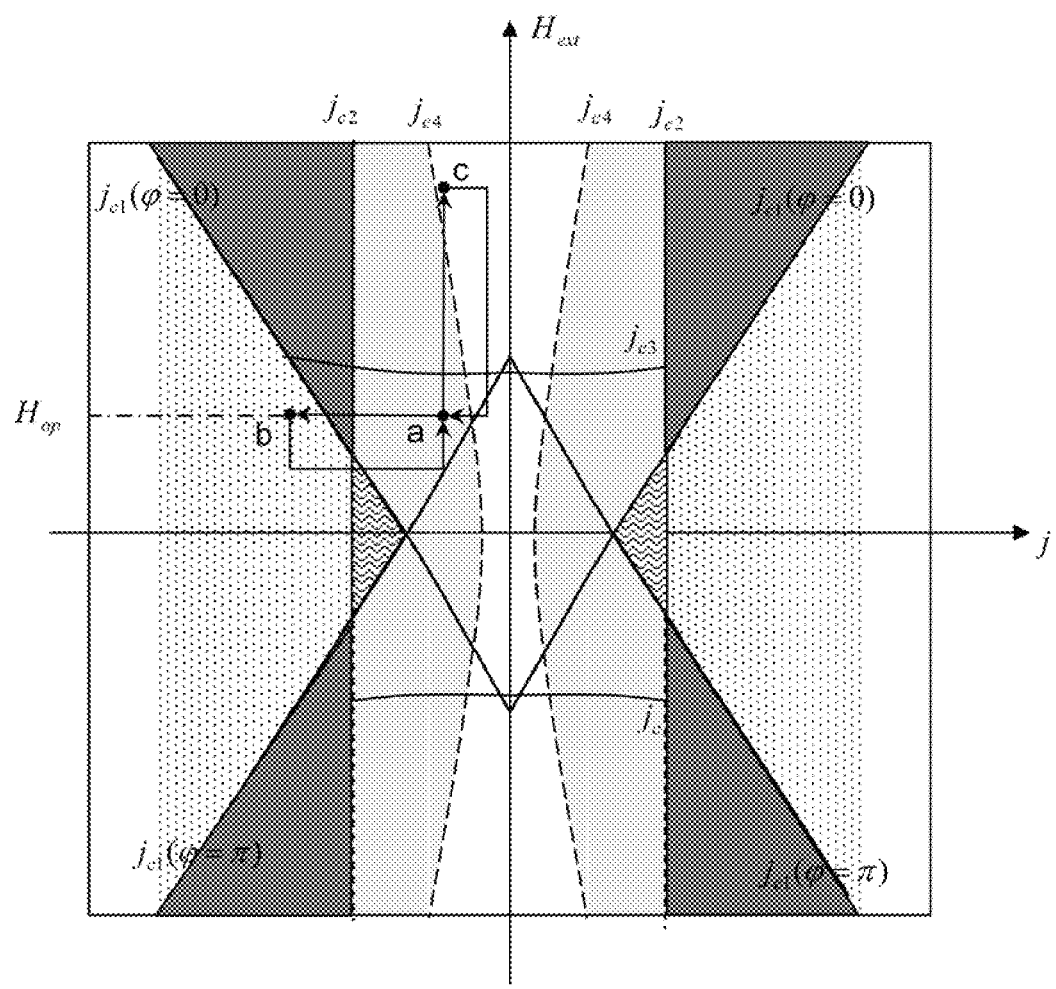
FIG. 9 illustrates a method for operating said structure as an oscillator according to a sixth embodiment of the invention.

FIG. 9 shows a method for operating the spin-transfer structure as an oscillator, according to a sixth embodiment of the invention.

This embodiment differs from the fifth embodiment only in that the oscillations are stopped by applying a pulse external magnetic field as in the third embodiment.

Finally, as in the region $j_{c1} < j_{c2}$, the second and fourth embodiments equally apply.

It should be noted that in all the embodiments of the invention, the oscillator is turned on by making the operating point cross the first critical line in a predetermined direction and back in the opposite direction. Similarly, the oscillator is turned off by making the operating point cross the fourth critical line in a predetermined direction and back in the opposite direction.

For either embodiment, the set-up time of turning the oscillations on and off is essentially limited by the duration of the rising and falling edges of the current/field pulse, which can be as low as a few tens of ps or faster. The duration of the pulses should be long enough for the magnetization vector to stabilize in the OPP or the OPS state.

Furthermore, the frequency of the oscillator can be tuned by properly setting the operating point. In practice, the frequency can be tuned across a range that can span 1 to 10 GHz, but the frequencies can be larger or lower, depending on the exact material parameters.

The invention can therefore be used for implementing gated RF sources and/or for frequency hopped RF sources e.g. for applications in the radar field or in wireless telecommunications.

The invention claimed is:

1. A method of operating a spin-transfer torque structure to generate voltage oscillations, said structure comprising:
  a first layer of magnetic material having a fixed magnetization vector,
  a spacer of non magnetic material, and
  a second layer of magnetic material having a free magnetization vector,
said method including the application of a current through said structure and characterized by the steps of:
  setting the operating point of the spin-transfer torque structure in a region of bistability in which the magnetization vector of the second layer remains in a stable static state when the region of bistability is entered from a static state and remains in a stable precessing state when the region of bistability is entered from a state of precessing;
  increasing the current in absolute values above a first threshold value, thereby inducing a precession of the magnetization vector of the second layer; and
  decreasing the current in absolute values below said first threshold value, the magnetizing vector of the second layer being thereby kept in said precessing state.

2. A method of operating a spin-transfer torque structure to generate voltage oscillations, said structure comprising:
  a first layer of magnetic material having a fixed magnetization vector,
  a spacer of non magnetic material, and
  a second layer of magnetic material having a free magnetization vector,
said method including the application of a current through said structure and characterized by the steps of:
  setting the operating point of the spin-transfer torque structure in a region of bistability in which the magnetization vector of the second layer remains in a stable static state when the region of bistability is entered from a static state and remains in a stable precessing state when the region of bistability is entered from a state of precessing;
  increasing the current in absolute values above a first threshold value, thereby causing the magnetization vector of the second layer to move out of the plane thereof; and then
  decreasing the current in absolute values below a threshold value causing the magnetizing vector of the second layer thereby to enter a stable precessing state.

3. The method according to claim 1 or 2, characterized in that the steps of increasing and then decreasing the current are performed by applying a current pulse.

4. The method according to claim 1 or 2, characterized in that it further comprises the application of a magnetic field ($H_{ext}$) in the plane of said second layer.

5. The method according to claim 1 or 2, characterized in that it further comprises a step of stopping said voltage oscillations by decreasing the current in absolute values until the operating point is moved out of said region of bistability into a region where only a static state of said magnetization vector is stable.

6. The method according to claim 5, characterized in that the step of stopping said voltage oscillations is performed by applying a current pulse.

7. The method according to claim 4, further comprising:
  stopping said voltage oscillations by varying the magnetic field in a predetermined direction until the operating point is moved out of said region of bistability into a region where only a static state of said magnetization vector is stable.

8. The method according to claim 7, wherein the step of stopping said voltage oscillations is performed by applying a magnetic field pulse.

9. A method of operating a spin-transfer torque structure to generate voltage oscillations, said structure comprising:

a first layer of magnetic material having a fixed magnetization vector,
a spacer of non magnetic material and
a second layer of magnetic material having a free magnetization vector,
said method including the application of a current ($j_{op}$) through said structure and a magnetic field ($H_{ext}$) in the plane of said second layer, said method being characterized by the steps of:
setting the operating point of the spin-transfer torque structure in a region of bistability in which the magnetization vector of the second layer remains in a stable static state when the region of bistability is entered from a static state and remains in a stable precessing state when the region of bistability is entered from a state of precessing;
varying the magnetic field in a predetermined direction until it crosses a threshold value, thereby inducing a precession of the magnetization vector of the second layer;
varying the magnetic field in the opposite direction until it crosses back said threshold value, the magnetizing vector of the free layer being thereby kept in said precessing state.

10. The method according to claim 9, characterized in that said steps of increasing the magnetic field in said predetermined direction and in said opposite direction are performed by applying a magnetic field pulse.

11. The method according to claim 9, characterized in that it further comprises a step of stopping said voltage oscillations by varying the magnetic field in said opposite direction until the operating point is moved out of said region of bistability into a region where only a static state of said magnetization vector is stable.

12. The method according to claim 11, characterized in that the step of stopping said voltage oscillations is performed by applying a magnetic field pulse.

13. The method according to claim 9, characterized in that it further comprises a step of stopping said voltage oscillations by decreasing the current in absolute values until the operating point is moved out of said region of bistability into a region where only a static state of said magnetization vector is stable.

14. The method according to claim 13, characterized in that the step of stopping said voltage oscillations is performed by applying a current pulse.

15. The method according to claim 14, characterized in that the magnetization vector of said first layer is orthogonal to the plane of this layer.

16. The method according to claim 15, characterized in that said spacer is a layer of non magnetic metal.

17. The method according to claim 9, characterized in that said spacer is a layer of insulating material.

18. The method according to claim 9, characterized in that the first layer of magnetic material and the second layer of magnetic material are made out of ferromagnetic material.

* * * * *

UNITED STATES PATENT AND TRADEMARK OFFICE
CERTIFICATE OF CORRECTION

PATENT NO. : 8,063,709 B2  
APPLICATION NO. : 12/525651  
DATED : November 22, 2011  
INVENTOR(S) : Ioana Firastrau, Ursula Ebels and Bernard Dieny Page 1 of 1

It is certified that error appears in the above-identified patent and that said Letters Patent is hereby corrected as shown below:

In Column 6, line 47, please insert a --,-- after "jc2" and before "the".

In Column 6, line 49, please delete "$M_z=M$" and insert -- $M_z = M_s$ -- therefore.

In Column 10, line 54, please delete "$H_u/2 \leq \alpha 4\pi M_S$" and insert -- $H_u/2 \geq \alpha 4\pi M_S$ -- therefore.

Signed and Sealed this
Twentieth Day of March, 2012

David J. Kappos
*Director of the United States Patent and Trademark Office*